United States Patent
Hong et al.

(10) Patent No.: US 6,495,407 B1
(45) Date of Patent: Dec. 17, 2002

(54) METHOD OF MAKING AN ARTICLE COMPRISING AN OXIDE LAYER ON A GAAS-BASED SEMICONDUCTOR BODY

(75) Inventors: Minghwei Hong, Watchung; Jenn-Ming Kuo, Edison; Jueinai Raynien Kwo, Watchung; Joseph Petrus Mannaerts, Summit; Yu-Chi Wang, Piscataway, all of NJ (US)

(73) Assignee: Agere Systems Inc., Allentown, PA (US)

(*) Notice: Subject to any disclaimer, the term of this patent is extended or adjusted under 35 U.S.C. 154(b) by 0 days.

(21) Appl. No.: 09/156,719

(22) Filed: Sep. 18, 1998

(51) Int. Cl.$^7$ ............................................. H02L 21/8238
(52) U.S. Cl. ........................................ 438/204; 438/795
(58) Field of Search ........................... 257/256; 438/186, 438/197, 204, 216, 285, 308, 795

(56) References Cited

U.S. PATENT DOCUMENTS

| | | | |
|---|---|---|---|
| 4,568,958 A | * 2/1986 | Baliga | 257/332 |
| 5,028,488 A | * 7/1991 | Nakagawa et al. | 136/258 |
| 5,451,548 A | 9/1995 | Hunt et al. | |
| 5,872,031 A | * 2/1999 | Mishra et al. | 438/216 |
| 6,274,887 B1 | * 8/2001 | Yamazaki et al. | 257/204 |

OTHER PUBLICATIONS

Y. Jeong, *IEEE Electron Device Letters*, vol. 15 (7), p. 251 (1994).
P. Pianetta et al., *Phys. Rev. Letters*, vol. 35(20), p. 1356 (1975).
*Very High Speed Integrated Circuits: Gallium Arenide LSI*, T. Ikoma, Editor, vol. 29 of Semiconductors and Semimetals, Willardson and Beer.
M. Hong et al., *J. Electronic Materials*, vol. 23, 625 (1994).

* cited by examiner

Primary Examiner—Michael Sherry
Assistant Examiner—Lisa Kilday
(74) Attorney, Agent, or Firm—Eugene E. Pacher

(57) ABSTRACT

A novel method of forming a GaAs-based MOS structure comprises ion implantation after oxide formation, and subsequent slow heating and cooling, carried out such that essentially no interfacial defects that are detectable by high resolution transmission electron microscopy are formed. If the MOS structure is a MOS-FET then metal contacts are provided in conventional fashion. A post-metallization anneal can result in FETs that are substantially free of drain current/voltage hysteresis. MOS-FETs made according to the novel method can be produced with high yield and can have significantly increased lifetime, as compared to some prior art GaAs-based MOS-FETs.

11 Claims, 7 Drawing Sheets

METHOD OF MAKING AN ARTICLE COMPRISING AN OXIDE LAYER ON A GAAS-BASED SEMICONDUCTOR BODY

CROSS REFERENCE TO RELATED APPLICATION

This application is related to co-assigned U.S. patent application Ser. No. 09/093,557, filed Jun. 8, 1998 by Hong et al; and Ser. No. 09/122,558, filed Jul. 7, 1998 by Chen et al. All patents, patent applications, and other references cited herein are incorporated herein by reference.

TECHNICAL FIELD

This invention pertains to methods of making articles that comprise an oxide layer on a GaAs-based semiconductor body, typically GaAs-based field effect transistors (FETs), and integrated circuits comprising such FETs.

BACKGROUND OF THE INVENTION

GaAs-based transistors and circuits are used in, for instance, wireless communication apparatus, high speed logic ICs and high power microwave devices, due inter alia to the relatively high electron mobility in GaAs, and the availability of semi-insulating GaAs substrates.

Early devices suffered from poor gate oxide/GaAs interface quality, including a high density of interface states. In recent years, substantial effort has been directed at this problem. For instance, U.S. Pat. No. 5,451,548 discloses formation of a $Ga_2O_3$ film on GaAs by e-beam evaporation from a high purity single crystal of $Gd_3Ga_5O_{12}$.

U.S. patent application Ser. No. 09/093,557 discloses articles (e.g., a GaAs-based MOS-FET) that comprises an oxide of overall composition $Ga_xA_yO_z$, where A is an element adapted for stabilization of Ga in the 3+ oxidation state, x is greater than or equal to zero, y/(x+y) is greater than 0.1, and z is selected to satisfy the requirement that both Ga and A are substantially fully oxidized.

The above-referenced '558 patent application discloses a method of making a GaAs-based MOS-FET that comprises a gate oxide layer of overall composition $Ga_xA_yO_z$, as defined above. The method comprises formation of the gate oxide layer subsequent to implant activation and other process steps, with no high temperature (e.g., >700° C.) processing being carried out subsequent to gate oxide formation.

The method of the '558 patent application, however, has been found to have shortcomings. In particular, the yield of acceptable devices is relatively low. Furthermore, and in common with other prior art GaAs-based metal/insulator/semiconductor FETs, devices made according to the '558 patent application exhibit significant hysteresis of the drain current/voltage characteristic, and also exhibit significant decrease of the drain current with time, resulting in devices frequently having unacceptably short life time. See, for instance, Y-H Jeong, *IEEE Electron Device Letters*, Vol. 15(7), p. 251 (1994), especially FIGS. 3 and 4. The reference discloses a 22% decrease of drain current over a period of $10^4$ s, and states that the disclosed MISFETs exhibit ". . . the best performance among the accumulation mode GaAs MISFETs." Clearly, for commercial use of GaAs-based MOS-FETs, the above referred-to hysteresis and decrease with time will have to be substantially eliminated.

In view of the potential advantages of GaAs-based MOS devices, it would be highly desirable to have available a method of making such devices that gives improved device yield. This application discloses such a method. The method also can produce MOS-FETs that are substantially free of drain current hysteresis, and that are also substantially free of drain current drift with time, and thus have long lifetime.

SUMMARY OF THE INVENTION

Embodiments of the invention comprise forming an insulator layer (typically but not necessarily an oxide layer) on a GaAs-based semiconductor surface. Just prior to the start of insulator formation the semiconductor surface is substantially atomically clean and substantially atomically ordered. The semiconductor surface typically is a (100) surface.

Herein a semiconductor surface is considered to be "substantially atomically clean" if surface coverage by impurity atoms is less than (typically substantially less than) 1% of a monolayer, preferably less than 0.1% of a monolayer. The degree of coverage by impurity atoms can be measured by a known technique (XPS). See, for instance, P. Pianetta et al., *Phys. Rev. Letters*, Vol. 35 (20), p. 1356 (1975).

A GaAs-based (100) semiconductor surface herein is considered to be "substantially atomically ordered" if the surface exhibits a clean 2×4 (or possibly 4×6 or other) RHEED (reflection high energy electron diffraction) pattern. Methods that can be used to produce a substantially atomically ordered (100) GaAs surface are known, as are techniques for producing a substantially atomically clean (100) GaAs surface. A GaAs surface that is substantially atomically clean and substantially atomically ordered is frequently referred to as a "reconstructed" surface.

The instant invention exemplarily is embodied in a method of making an article (e.g., an IC, or a personal communication device that comprises the IC) that comprises a GaAs-based MOS-FET having improved characteristics, including a low gate oxide/semiconductor midgap interface state density.

More specifically, the invention exemplarily is embodied in a method of making an article that comprises a GaAs-based MOS-FET comprising a GaAs-based substrate having a major surface, two spaced apart regions of a first conductivity type extending from the major surface into the substrate (designated "source" and "drain", respectively), a metal contact disposed on each of said source and drain, with an oxide layer (designated "gate oxide") disposed on the major surface between the source and the drain, and with a gate metal contact disposed on the gate oxide layer.

The MOS-FET advantageously is a planar device (i.e., the semiconductor surface is planar, without etched recesses or epitaxial regrowth), the source and drain regions extend into the GaAs-based material of a second conductivity type, associated with the gate oxide/semiconductor interface is a midgap interface state density of at most $10^{11}$ $cm^{-2}$ $eV^{-1}$.

The gate oxide layer typically but not necessarily has overall composition $Ga_xA_yO_z$, where Ga substantially is in a 3+ oxidation state, where A is one or more electropositive stabilizer element for stabilizing Ga in the 3+ oxidation state, x is greater than or equal to zero, y/(x+y) is greater than or equal to 0.1, and z is sufficient to satisfy the requirement that Ga and A are substantially fully oxidized. Herein, Ga and A each are considered to be "substantially fully oxidized" if at least 80% (preferably at least 90%) of the respective element is fully oxidized, i.e., is in the highest oxidation state of the element. The highest oxidation state of Ga is 3+. The highest oxidation state of A depends on A. For instance, if A is an alkaline earth, then the state is 2+, and if A is Sc, Y, or a rare earth element, then the state is frequently, but not always, 3+.

The method of making the article comprises the steps of providing the GaAs-based semiconductor body (typically a semi-insulating GaAs substrate with a layer of epitaxial doped GaAs thereon), with at least a portion of the surface of the epitaxial layer being essentially atomically clean and essentially atomically ordered, forming, in situ, the oxide layer on the essentially atomically clean and ordered surface; implanting at least one ion species through the oxide layer and the interface into the first conductivity type region; heating the substrate with the oxide layer thereon to a temperature effective for activating at least a major portion of the implanted ions, with the heating carried out such that essentially no defects of a type that is detectable by high resolution transmission electron microscopy (HR-TEM) are formed at the interface; providing a source contact, a drain contact and a gate contact of the MOS-FET; and subjecting the MOS-FET to a post-metallization anneal selected such that the MOS-FET is substantially free of a drain current/voltage hysteresis.

The forming step exemplarily comprises forming the oxide layer such that the oxide layer has overall composition $Ga_xA_yO_z$, as defined above.

In an exemplary embodiment of the method the oxide layer is formed by simultaneous deposition from two (or possibly more) deposition sources, with one of the sources containing $Ga_2O_3$ (typically in powder form), and the other containing an oxide of a stabilizer element (e.g., $Gd_2O_3$), typically also in powder form. In another exemplary embodiment the oxide layer is formed by deposition from a single deposition source containing an oxide of a stabilizer element, e.g., $Gd_2O_3$, or a Ga-Gd-oxide such as $Gd_3Ga_5O_{12}$.

As those skilled in the art know, it is common practice in the field of GaAs-based devices to carry out heat treatments by rapid thermal annealing (RTA), since the long heating times used in furnace annealing ". . . caused some undesirable effects, such as substrate-quality degradation and implanted-dopant diffusion." See *Very High Speed Integrated Circuits: Gallium Arsenide LSI,* especially Ch. 1, III, "Rapid Thermal Annealing", p. 27–28, and middle of p. 54, T. Ikoma, Editor, Vol. 29 of *Semiconductors and Semimetals,* Willardson and Beer. However, we have discovered that using RTA, for instance for implant activation, frequently results in formation of defects at the GaAs/oxide interface. We currently believe that these defects are at least partially responsible for the low device yield. We have also discovered heat treatments (involving relatively slow heating and/or cooling) that do not result in formation of the above referred to defects, such that it is now possible to manufacture with high yield GaAs-based MOS-FETs with excellent characteristics, including long lifetime and substantially no drain current hysteresis.

BRIEF DESCRIPTION OF THE DRAWINGS

Like or analogous features generally are designated by the same numeral in different figures. The figures are not intended to be to scale or in proportion.

DETAILED DESCRIPTION OF THE INVENTION

We have previously found that, by providing a substantially atomically clean and substantially atomically ordered (typically (100)-oriented) surface of a GaAs-based semiconductor body, and by appropriately limiting exposure of the surface to contaminants prior to completion of the first monolayer of oxide dielectric material on the surface, GaAs-based semiconductor/oxide layer structures having good interface characteristics can be produced.

Although in principle any apparatus that can provide the substantially atomically clean surface and the required low exposure to contaminants is potentially suitable for the practice of the invention, in practice the apparatus typically will comprise one or more UHV chambers. In the case of multichamber apparatus, two chambers will generally be linked together by a transfer module which facilitates transfer of the semiconductor body from one chamber to the other without exposure of the body to the ambient atmosphere. Typically the transfer is under UHV conditions. Such apparatus is known. See, for instance, M. Hong et al., *J. Electronic Materials,* Vol. 23, 625 (1994).

Exemplarily, our apparatus comprises a MBE growth chamber (background pressure typically about $2\times10^{-11}$ Torr), a dielectric film deposition chamber (typically about $1\times10^{-10}$ Torr), and a transfer module (typically about $6\times10^{-11}$ Torr) that links the former chambers.

Figure 1:
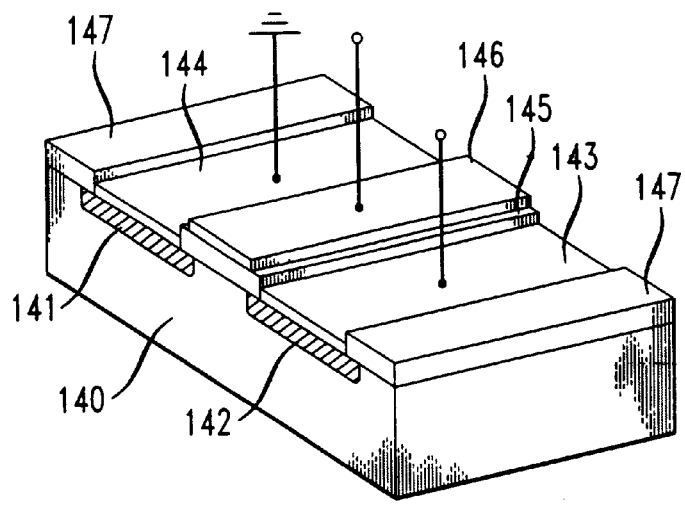
FIG. 1 schematically depicts an exemplary device according to the invention, namely, a GaAs-based MOS-FET.

FIG. 1 schematically depicts an exemplary electronic device, namely, a GaAs-based MOS-FET. Numerals 140–147 refer, respectively, to the GaAs body (exemplarily p-type), the source region (exemplarily n-type), the drain region (exemplarily n-type), the drain contact, the source contact, the gate oxide, the gate contact and the field oxide. Associated with the interface between 140 and 145 is an interface state density $<10^{11}/cm^2$ .eV, and typically a recombination velocity $<10^4$ cm/s.

The method of making a GaAs MOSFET that is disclosed in the above-referenced '558 patent application comprises surface re-construction and gate oxide deposition after ion implantation and implant activation. This sequence of steps can result in MOS devices having low interface state density, but the yield of such devices typically is low. Thus, one of the objectives of our continuing research was the elucidation of the reason for the low device yield, and the discovery of a convenient higher yield process. A further objective was the elucidation of a method that can result in GaAs MOS-FETs having substantially no drain current/voltage hysteresis, and substantially no drain current drift (decrease) with time. The below-described method can meet these objectives.

Figure 2:
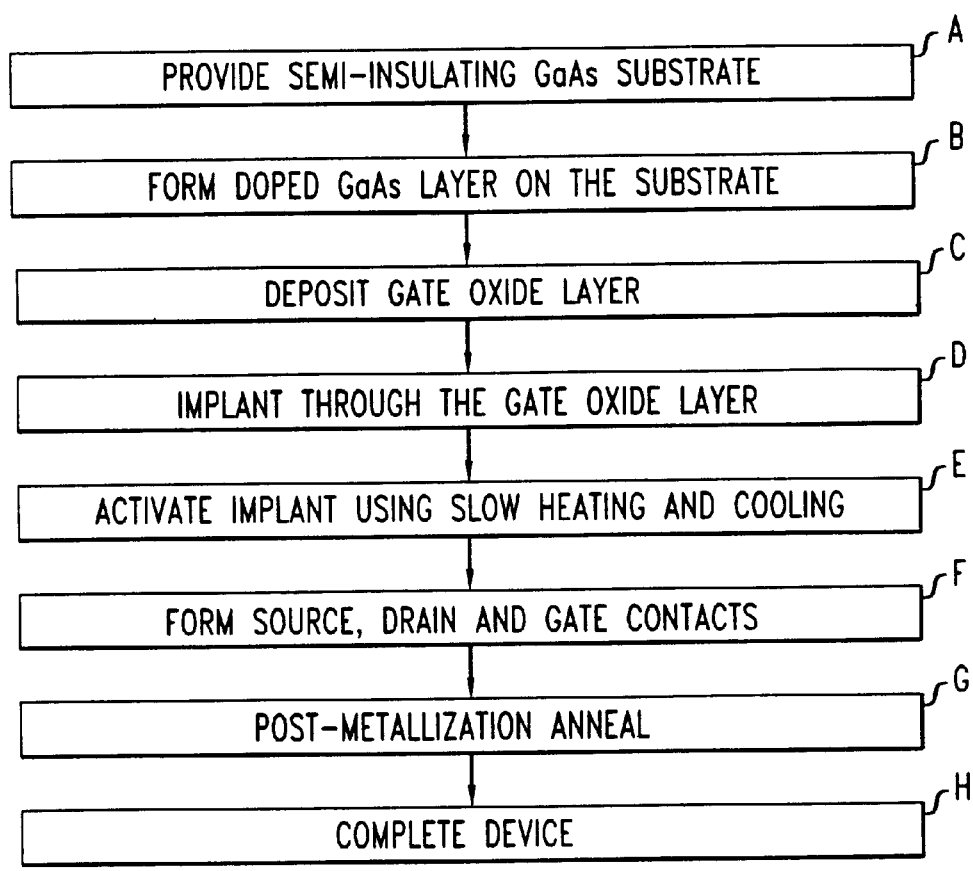
FIG. 2 shows steps of the inventive method in flow chart form.

FIG. 2 shows, in flow chart form, important steps of the inventive method. Steps A and B are conventional. Step B typically results in a surface that is substantially atomically clean and atomically ordered. If, however, the surface quality is not as desired then a simple conventional treatment typically suffices to give the desired surface reconstruction.

The wafer is typically transferred under UHV to an oxide growth chamber, and deposition of the gate oxide layer is commenced. See step C. The deposition can be as described previously, using a single deposition source (e.g., $Gd_2O_3$, $Gd_3Ga_5O_{12}$ or other Ga-Gd-oxide) or a multiplicity of such sources (e.g., $Gd_2O_3$ and $Ga_2O_3$ powder in separate sources). Other oxides may also be useful.

After completion of deposition of the gate oxide layer, appropriate atoms are implanted into the doped GaAs layer through the oxide layer. See step D.

This can be done in conventional fashion. Exemplarily, $O^+$ ions are implanted for isolation, and/or Si is implanted to form the source and drain regions.

Step E involves an activation anneal of the implant, and will be discussed in detail below. Significantly, the step is carried out such that substantially no defects (observable by HR-TEM) are formed at the interface.

Step F can be substantially conventional, including patterning of a photoresist layer, and etching through the gate oxide layer in the source and drain regions. It also includes deposition of the gate contact.

Step G includes a post-metallization anneal that can substantially eliminate drain current/voltage hysteresis, and Step H includes such conventional steps as testing, dicing, wire bonding, and/or encapsulation.

Some preferred embodiments of the inventive method comprise an annealing step after gate oxide deposition but before the ion implantation of step D. This is believed to result in decreased trap density at the interface. Exemplarily, the anneal is carried out under forming gas or an inert atmosphere and comprises heating to 700° C. at 10° C/min, maintaining at 700° C. for three hours, and cooling at 10° C/min.

We have also found that a post-metallization anneal can result in essential elimination of drain current/voltage hysteresis. See FIGS. 23 and 24. Exemplarily, the heat treatment involves heating (at 10° C/min) to 375° C, holding at 375° C. for three hours, and cooling to room temperature (at 10° C/min), all under forming gas. The heating and cooling rates are not critical, provided they are low enough to avoid formation of defects detectable by HR TEM. Typically, the rates are in the range 1–300° C./min. The annealing temperature and time generally are selected to result in devices substantially free of drain current/voltage hysteresis. By way of example, we have found that devices that were annealed at 350° C. or lower (3 hours at temperature, heating and cooling rates 10° C/min) were not substantially free of the hysteresis, whereas devices that were annealed at 375° C. (other conditions being as above) were substantially free of the hysteresis. Since other heat treatment conditions (e.g., a shorter time at higher temperature) could also yield the desired result, routine experimentation will generally be required to obtain optimal results.

Figure 3:
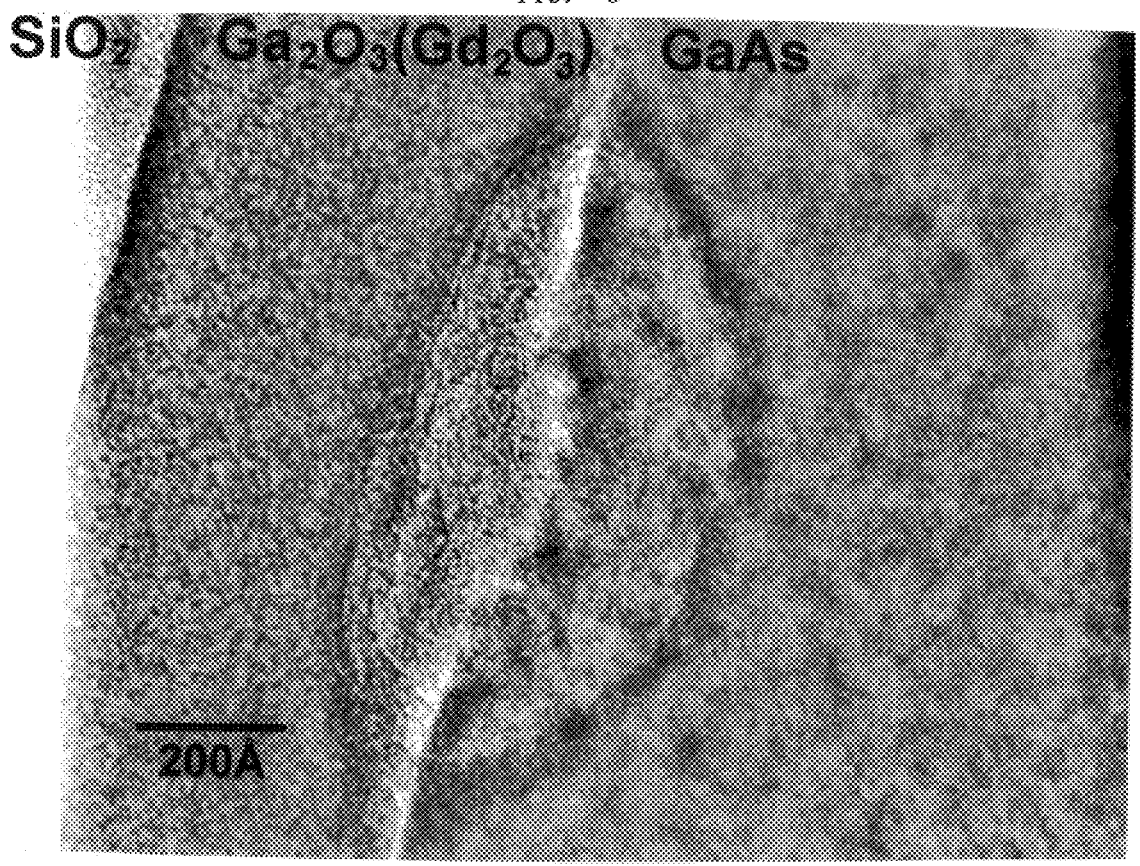
FIG. 3 is a high resolution transmission electron micrograph of a portion of a Ga-Gd-oxide/GaAs interface that was subjected to conventional RTA.

FIG. 3 is a high resolution transmission electron micrograph of a portion of the interface between GaAs and a Ga-Gd-oxide layer thereon. The oxide layer was formed in situ on a reconstructed GaAs surface, with a protective $SiO_2$ layer deposited over the Ga-Gd-oxide. The combination was then subjected to RTA to 700° C., (heating rate about 50–100° C./s) for 45s, followed by rapid cooling. The figure clearly shows a defect region at the interface which, we believe, is at least a significant contributor to the low yield problem. To the best of our knowledge, nothing in the prior art discloses or suggests the presence of the RTA-induced defects discovered by us. "RTA" is used herein to refer to any rapid heating process, typically with heating (and cooling) rates in the approximate range 1000–6000° C./min.

After our discovery of the interfacial defects in $SiO_2$/Ga-Gd-oxide/GaAs combinations subjected to RTA, we directed our research towards finding a heat treatment that did not produce the interfacial defects. We made the discovery that a slow heating/slow cooling treatment can result in an interface free (to the best of our knowledge) of the interfacial defects. This discovery is surprising since it is generally believed that RTA is less likely to produce damage in GaAs than is slow heating.

Exemplarily, we have found that a heat treatment of the oxide-covered GaAs that involves slow heating (e.g., 1° C./s) to about 700° C., a soak (e.g., 1 hour at that temperature), and a slow cool (e.g., 1° C./s) to room temperature leaves the oxide/GaAs interface essentially free of defects detectable by HR-TEM (resolution typically 0.2–0.3 nm or better).

By way of further example, we have carried out Si activation in a furnace (850° C. for five minutes) under a protective atmosphere (forming gas and As overpressure), with slow (e.g., 10° C./min) heating and cooling such that the interface is essentially free of defects.

As indicated above, the inventive method comprises at least one heat treatment (e.g., an activation anneal) involving much slower temperature changes than is customary. Typically, the rate of change is less than about 300° C./min over at least a part of the temperature range of interest, typically room temperature to 850° C. The rate of change is not necessarily constant, and "soaks" at appropriate temperatures are not precluded. By way of example, an $O^+$ activation anneal for a depletion mode GaAs MOS-FET involved a) a slow ramp-up (1° C./s) to 300° C., and maintaining the wafer at 300° C. for 300 s; b) a 1° C./s ramp-up to 400° C., and maintaining the wafer at 400° C. for 300 s; c) a 1° C./s ramp-up to 500° C., and maintaining the wafer at 500° C. for 20 s; d) ramp down at 1° C./s to room temperature, all under He. Other inert gases are also suitable.

Figure 4:
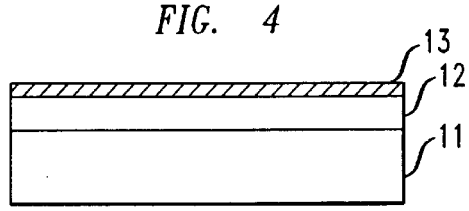
FIGS. 4–9 show a depletion-mode GaAs MOS-FET at several manufacturing stages according to the invention.
Figure 5:
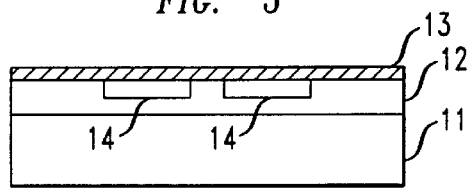
Figure 6:
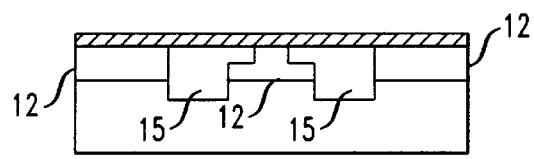
Figure 7:
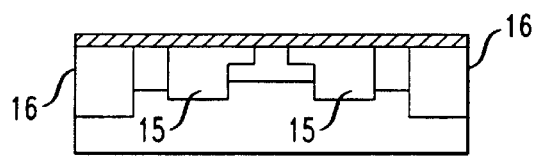
Figure 8:
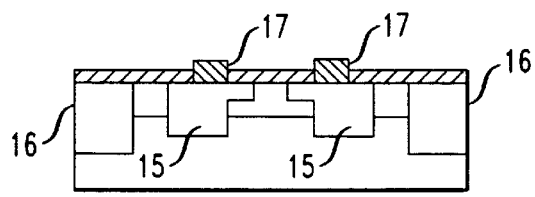
Figure 9:
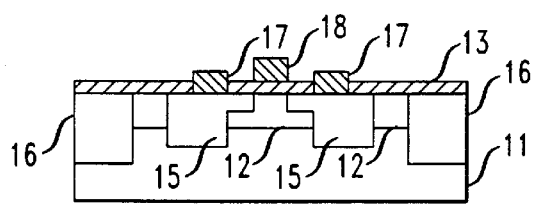

FIGS. 4–9 schematically show a sequence of processing steps for an n-channel depletion-mode GaAs MOS-FET according to the invention. In FIG. 4, numerals 11–13 refer, respectively, to the semi-insulating GaAs substrate, the n-doped epitaxial GaAs layer (also referred to as the "channel" layer), and the gate oxide layer. The oxide layer is deposited on the substantially atomically clean and atomically ordered (100) surface of the channel layer. In FIG. 5, numerals 14 refer to low density Si-implanted (n-type) regions. A high density Si implant forms region 15 in FIG. 6. After a Si activation anneal, isolation region 16 of FIG. 7 is formed by O+ implantation, followed by an activation anneal. The oxide layer 13 is patterned, and source and drain contacts are formed. See FIG. 8. Finally, FIG. 9 shows the processed device, including gate contact 18.

In the above sequence of steps, the steps of FIGS. 5–6 are optional. Their absence results in a device without Si-implanted regions 14 and 15.

Figure 10:
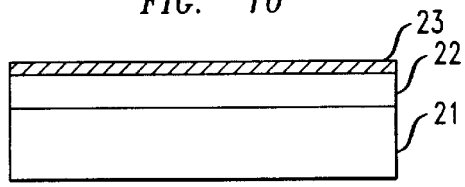
FIGS. 10–16 show an enhancement-mode GaAs MOS-FET at several manufacturing stages according to the invention.
Figure 11:
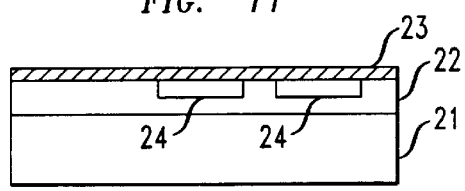
Figure 12:
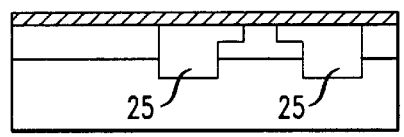
Figure 13:
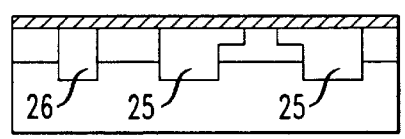
Figure 14:
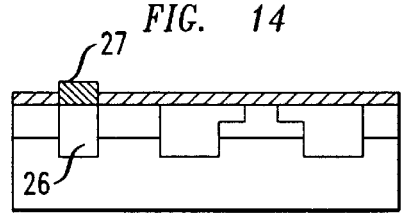
Figure 15:
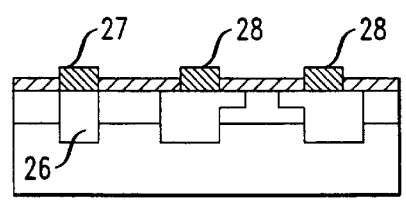
Figure 16:
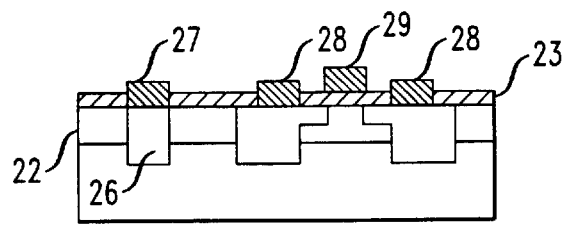

FIGS. 10–16 schematically show a sequence of processing steps for an n-channel enhancement-mode GaAs MOS-FET according to the invention. In FIG. 10, numerals 21–23 refer, respectively, to the semi-insulating GaAs substrate, the p-epitaxial (100) GaAs layer (channel layer), and the gate oxide layer deposited on the substantially atomically clean and atomically ordered (100) surface of the channel layer. FIG. 11 shows the low density Si implanted regions 24, and FIG. 12 shows the source and drain regions 25 after a high density Si implant. FIG. 13 further shows p-well contact implant 26. After an activation anneal the oxide layer 23 is patterned to facilitate metallization. FIG. 14 shows well contact 27, FIG. 15 further shows source and drain contacts 28, and FIG. 16 further shows gate contact 29.

EXAMPLE 1

Depletion-mode GaAs MOS-FETs were made as follows. On a conventional semi-insulating (100 oriented) GaAs substrate was grown a not intentionally doped GaAs buffer layer, followed by growth of a 100 nm Si-doped (n-type) epitaxial GaAs channel layer ($4 \times 10^{17}$ cm$^{-3}$). The epitaxial layers were grown by MBE at 580–600° C. in a multi-chamber UHV system that comprised a solid source GaAs MBE chamber, an oxide chamber, other known functional members, and UHV transfer modules connecting these chambers. The background pressure for the oxide chamber and the transfer modules was $<10^{-9}$ Torr and $2-5 \times 10^{-10}$ Torr, respectively. During cooling of the wafer after epitaxial growth, an As-stabilized C(2×4) GaAs surface was maintained, as verified by RHEED. The wafer was then transferred in-situ via the UHV transfer modules to the oxide chamber. On the atomically clean and ordered (100) GaAs surface was deposited, by e-beam evaporation from a single crystal target of $Ga_5Gd_3O_{12}$, a 54 nm thick Ga-Gd-oxide film. The film was of composition $Ga_{6.4}Gd_{3.6}O_x$, and was grown at a substrate temperature of about 550° C. The film thickness was measured by means of ellipsometry and X-ray reflectivity. The oxygen content was sufficient to essentially completely oxidize the metal constituents.

After oxide formation, device isolation was achieved by oxygen implantation ($2 \times 10^{13}$ cm$^{-2}$, 200 keV) through the oxide. In conventional fashion, a 3 μm patterned layer of photoresist was used as the implant mask. The wafer was then subjected to a heat treatment (1° C./s to 300° C., 300 s at 300° C; 1° C./s to 400° C., 300s at 400° C; 1° C./s to 500° C., 20 s at 500° C; 1° C./s to room temperature, all under He) for implant activation. This was followed by patterning of the oxide layer by removal of the oxide (using a known HCl-based solution) from the source and drain regions, using the previously referred-to photoresist pattern. After oxide removal, Ge/Ni/AuGe/Ag/Au (5/5/26.8+13.2/50/100 nm) was deposited in conventional fashion to provide the n-ohmic metal contacts. Finally, the gate contact and interconnections were made in conventional fashion by e-beam evaporation of Ti/Pt/Au (25/50/300 nm) and lift-off, and the MOS-FETs were subjected to a post-metallization anneal.

After completion of device manufacture, various device characteristics were measured on randomly selected devices. FIGS. 17–22 show exemplary results obtained from MOS-FETs with mixed oxide (Ga-Gd-oxide, with Gd about 36 atomic percent of the total metal content) gate insulator layer, produced substantially as described above.

Figure 17:
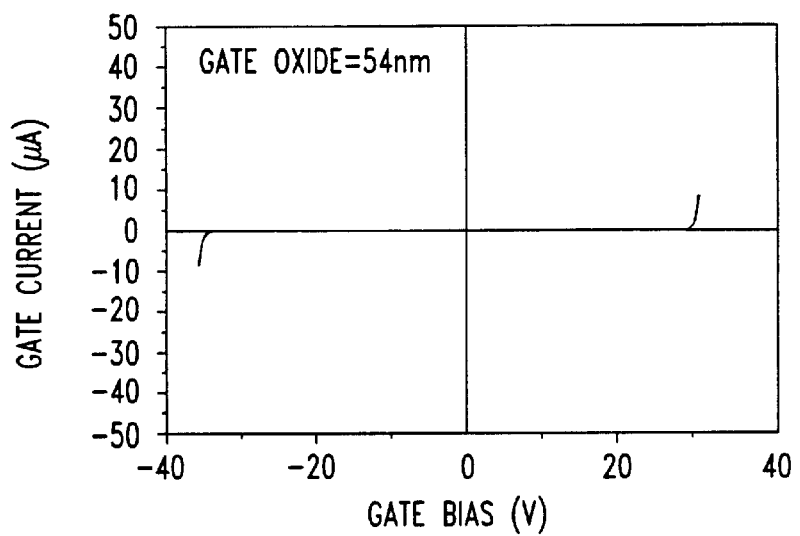
FIGS. 17–22 show characteristics of depletion-mode GaAs MOS-FETs produced according to the invention.
Figure 18:
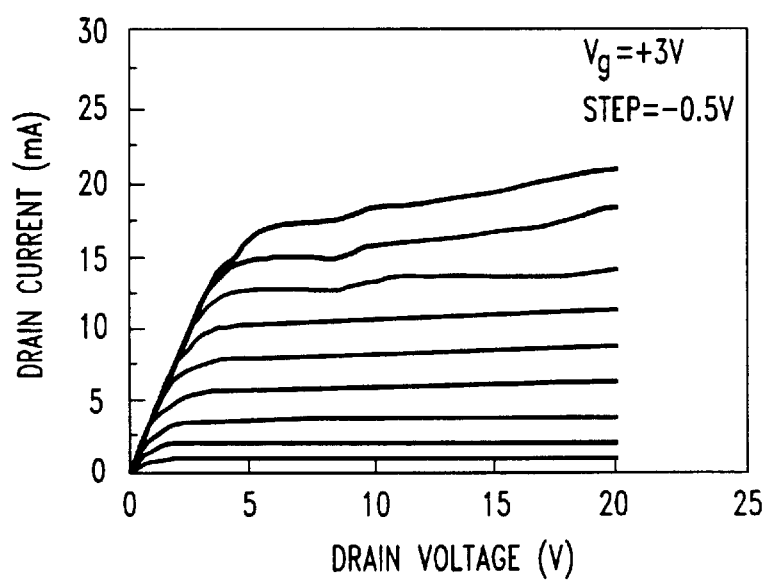
Figure 19:
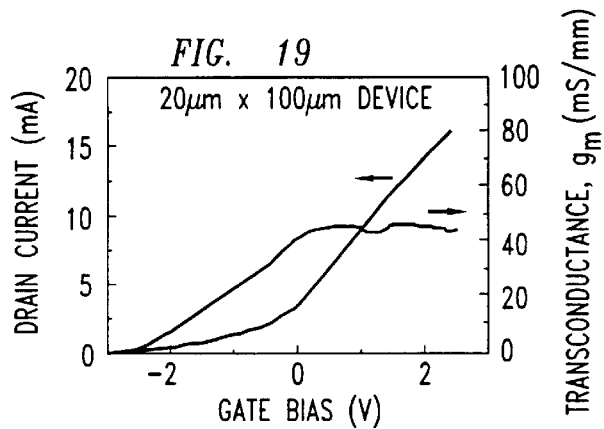
Figure 20:
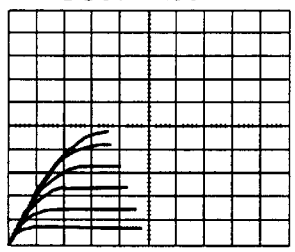

FIG. 17 shows the gate I-V characteristics of a MOS structure with 54 nm Ga-Gd-oxide layer. The breakdown behavior is symmetrical, with the breakdown voltage being as high as 35V (about 6.5 MV/cm). FIG. 18 shows the drain I-V characteristics of a 20×100 μm device with 54 nm Ga-Gd-oxide gate oxide. The device can be operated in the accumulation mode up to +3V gate voltage. Higher forward gate voltages for accumulation mode operation can be obtained for devices with larger gate length. This indicates a high quality oxide/GaAs interface. The maximum drain current density and the peak conductance are 200 mA/mm and 50 mS/mm, respectively. The flat transconductance profile shown in FIG. 19 reveals the advantage of MOS-FETs according to the invention for linearity consideration. FIG. 20 shows the output characteristics of an exemplary (3.25 μm×100 μm) device, as measured with a conventional curve tracer. Essentially, no I-V hysteresis and drain current drift were observed, in contradistinction to prior art results. The essentially complete absence of said hysteresis and drift inter alia indicates insignificant oxide charges and low interface state density. In FIG. 20, the vertical scale is 5 mA/div, the horizontal scale is 1V/div, $V_g$=+1.5V, and the step size is –0.5V. The device exhibited a short-circuit current gain cut-off frequency $f_t$ of 4.8 GHz and a maximum oscillation frequency $f_{max}$ of 40.1 GHz.

Figure 21:
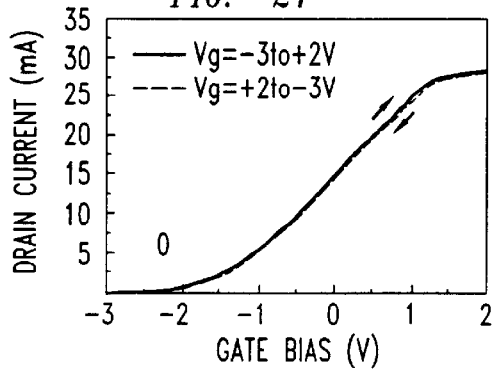

FIG. 21 shows the drain current as a function of gate bias in both forward and reverse sweep directions, for an exemplary device according to the invention. As can be readily seen, the device showed negligible hysteresis, indicative of, inter alia, low mobile charge density and essentially no charge injection.

Figure 22:
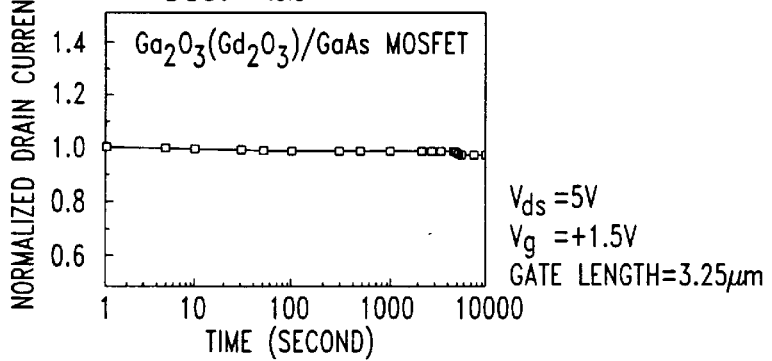

FIG. 22 shows the drain current of an exemplary device as a function of time. The device had gate length 3.25 μm, and the measurement was made with $V_{ds}$=5V, and $V_g$=+1.5V. The variation of the drain current is less than 1.5% for the period 1 s–$10^4$ s. The drain current was substantially unchanged after two months, and tests are continuing, with the device continuing to perform as expected.

The essential absence of drain current hysteresis and the nearly complete absence of drain current drift in MOS-FETs according to the invention constitutes, in our opinion, a significant advance towards the manufacture of commercially useful GaAs-based planar MOS-FETs. This is especially true in view of the excellent linearity, high transconductance, high gate breakdown voltage and large accumulation gate voltage also observed in devices produced according to the invention.

Figure 23:
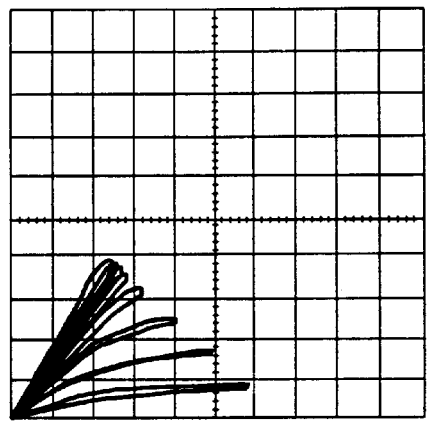
FIGS. 23 and 24 show output I–V characteristics of exemplary devices without and with post-metallization anneal.
Figure 24:
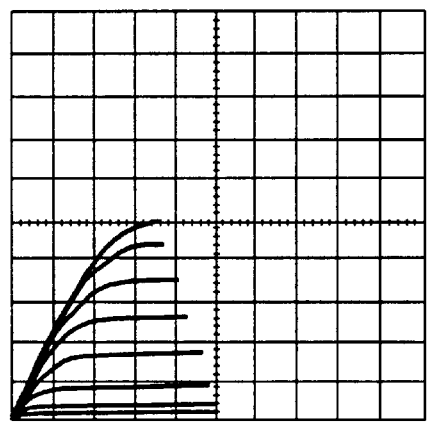

Currently preferred embodiments of the invention comprise a post-metallization anneal. Such an anneal can result in considerably improved device characteristics, especially reduced drain current/voltage hysteresis. This is demonstrated by FIGS. 23 and 24, which show the output I–V characteristics of an exemplary device according to the invention produced without post-metallization anneal and with such an anneal, respectively. The anneal involved heating (10° C./minute) to 375° C., maintaining at 375° C. for 3 hours, and cooling (10° C./minute) to room temperature, all under forming gas. Of course, other combinations of time and temperature (e.g., a shorter time at higher temperature) may also be operative, and can be established by some minor experimentation. It is, of course, imperative that the conditions of this (and all other heat treatments) are selected such that substantially no interfacial defects that are detectable by HR-TEM are produced. In FIGS. 23 and 24, the measurement conditions are as in FIG. 20.

Figure 25:
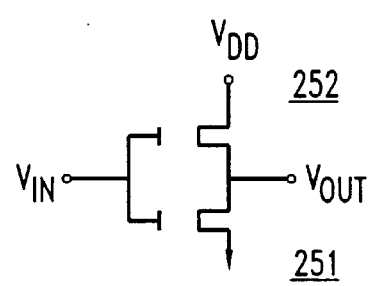
FIG. 25 shows the diagram of an exemplary circuit comprising complementary MOS-FETs made according to the invention.

Those skilled in the art will appreciate that the above-described method of making a depletion mode MOS-FET and the method of making an enhancement mode MOS-FET can be readily combined to produce depletion mode and enhancement mode MOS-FETs on a common substrate. The resulting combination exemplarily is substantially as shown in FIG. 17 of the '557 application. The thus produced MOS-FETs can be electrically connected in conventional manner to form an integrated circuit, e.g., an inverter, as shown schematically in FIG. 25, wherein numeral 251 refers to an n-channel enhancement mode GaAs MOS-FET, and 252 refers to a p-channel enhancement mode GaAs MOS-FET, both substantially as shown in said FIG. 17. The circuit per se is conventional, but the method of making the MOS-FETs is novel, and can provide the circuit with previously unattainable properties. The inverter of FIG. 25 is representative of integrated circuits according to the invention.

As those skilled in the art will recognize, the above-described process not only is suitable for producing GaAs-based planar n-channel and p-channel MOS-FETs on the same substrate, but can also be used to combine such MOS-FETs with GaAs (metal-semiconductor) MES-FETs. In order to produce a MES-FET, the gate oxide exemplarily is removed from the respective gate region, and an appropriate metal (e.g., Ti/Pt/Au) is deposited in the gate region to provide a Schottky barrier contact. GaAs-based MES-FETs are known and do not require detailed description.

EXAMPLE 2

A pair of complementary MOS-FETs on a common substrate is produced substantially as described above, except that the ion implantation is modified to produce implanted regions as required. The pair of MOS-FETs is connected as shown in FIG. 25 to form an inverter circuit. The circuit is tested and performs as expected.

EXAMPLE 3

A multiplicity of n-MOS-FETs, p-MOS-FETs and n- and p-MES-FETs is formed on a common substrate, substantially as described in Example 2, except that the gate oxide is removed from some of the n-type devices and some of the p-type devices, and 25 nm Ti/30 nm Pt/300 nm Au is deposited in the gate regions of these devices. After provision of conductive interconnects between the devices, the resulting circuit is tested and performs as expected.

The invention claimed is:

1. A method of making a GaAs-based integrated circuit comprising at least one planar metal-oxide-semiconductor field effect transistor ("MOS-FET"), the method comprising
   a) providing a GaAs-based substrate having a major surface and a first conductivity type region, with at least a portion of said major surface being essentially atomically clean and atomically ordered;
   b) forming a layer of oxide at least on said portion of the major surface, the oxide forming an interface with the substrate;
   c) implanting ions of at least one ion species through said layer of oxide and said interface into said first conductivity type region;
   d) heating the substrate with the oxide layer thereon to a temperature effective for activating at least a major portion of the implanted ions, said heating carried out such that essentially no defects of a type that is detectable by high resolution transmission electron microscopy are formed at said interface;
   e) providing a source contact, a drain contact, and a gate contact of the MOS-FET; and
   f) subjecting the MOS-FET to a post-metallization anneal selected such that the MOS-FET is substantially free of drain current/voltage hysteresis.

2. Method according to claim 1, wherein step d) comprises heating said substrate at a rate in the range 1–300° C./minute.

3. Method according to claim 2, wherein step d) comprises heating the substrate at a rate in the range 1–100° C./min.

4. Method according to claim 1, wherein step d) comprises heating the substrate in a furnace.

5. Method according to claim 1, comprising a further step of annealing the substrate, the further step carried out after oxide deposition and before ion implantation, said further annealing step selected to provide a decreased interfacial trap density.

6. Method according to claim 1, wherein said post-metallization anneal comprises heating the substrate to a temperature above 350°.

7. Method according to claim 1, wherein step b) is carried out such that the oxide has overall composition $Ga_xA_yO_z$, where Ga is substantially in a 3+ oxidation state, A is one or more electropositive stabilizer element adapted for stabilizing Ga in the 3+ oxidation state, x is greater than or equal to zero, z is selected to satisfy the requirement that both Ga and A are substantially fully oxidized, and y/(x+y) is greater than 0.1.

8. Method according to claim 7, wherein A is selected from the group consisting of Sc, Y, the rare earth elements and the alkaline earth elements.

9. Method according to claim 8, wherein A is selected from the group consisting of Sc, Y, La, Nd, Gd, Dy, Ho, Er and Lu.

10. Method according to claim 9, wherein A is Gd.

11. Method according to claim 1, wherein the GaAs-based substrate comprises semi-insulating GaAs.

* * * * *